United States Patent [19]
Shen

[11] Patent Number: 5,495,392
[45] Date of Patent: Feb. 27, 1996

[54] CPU HEAT DISSIPATING APPARATUS

[76] Inventor: Tsan-Jung Shen, 3F., No. 52, Lane 280, Min Chuan E. Rd., Sec. 6, Taipei, Taiwan

[21] Appl. No.: 399,042

[22] Filed: Mar. 6, 1995

[51] Int. Cl.⁶ ...................................................... H05K 7/20
[52] U.S. Cl. .......................... 361/697; 165/80.3; 165/121; 165/185; 257/718
[58] Field of Search .................................. 165/80.2, 80.3, 165/121–122, 185; 174/16.3; 257/718–719, 726–727; 361/695–697, 704, 707, 710, 715–718, 722

[56] References Cited

U.S. PATENT DOCUMENTS

| | | | |
|---|---|---|---|
| 5,287,249 | 2/1994 | Chen | 361/718 |
| 5,299,632 | 4/1994 | Lee | 165/80.3 |
| 5,421,402 | 6/1995 | Lin | 165/80.3 |
| 5,430,610 | 7/1995 | Hung | 361/697 |

*Primary Examiner*—Gregory D. Thompson
*Attorney, Agent, or Firm*—Bacon & Thomas

[57] ABSTRACT

A CPU heat dissipating apparatus including a radiating panel attached to the top side of a CPU to hold a fan between two opposite upright side walls on the radiating panel, and a mounting frame fastened to the CPU to hold down the heat sink, wherein the mounting frame has two short downward hooks respectively hooked on two opposite mounting grooves on two opposite upright side walls of the radiating panel, two long downward hooks hooked on the border of the CPU to tightly secure the radiating panel to the CPU, and two oblique finger plates for moving by fingers to deform the mounting frame for permitting the long downward hooks to be hooked on or released from the CPU.

4 Claims, 3 Drawing Sheets

CPU HEAT DISSIPATING APPARATUS

BACKGROUND OF THE INVENTION

The present invention relates to CPU heat dissipating apparatus which comprises a radiating panel attached to the top side of a CPU to hold a fan between two opposite upright side walls thereof, and a mounting frame hooked on the radiating panel and the CPU by hooks to hold down the radiating panel on the CPU.

A variety of radiating panels have been developed and intensively used with electric fans to carry heat from CPUs. There is known a radiating panel having two upright side walls for holding a fan and two downward hooks for fastening to a CPU. The upright side walls of this structure of radiating panel have a respective inward top flange for holding the fan between the upright side walls. When the radiating panel, the fan, and the CPU are packed together, the fan as well as the CPU tend to slip from the radiating panel during transportation.

There is known another structure of radiating panel having screw holes in the four corners of the top sides thereof for mounting a fan by screws, and downward hooked portions for holding a CPU. When a CPU is attached to the bottom side of the radiating panel between the downward hooked portions, it is fixed to the radiating panel by snaps. Because the fan is securely fixed to the radiating panel by screws, the loading and unloading procedures of the fan are complicated. Another drawback of this structure of radiating panel is that the contact pins of the CPU tend to be deformed or damaged when the snaps are operated to securely fix the CPU to the radiating panel.

Furthermore, regular commercially available CPUs may vary with one another in thickness. If the size of the downward hooks or snaps does not match with the thickness of the CPU, the CPU will not be tightly attached to the bottom side of the radiating panel when the CPU and the radiating panel are fastened together. If the radiating panel is not tightly attached to the top side of the CPU, heat from the CPU cannot be efficiently carried away from the CPU through the radiating panel.

SUMMARY OF THE INVENTION

The present invention has been accomplished to provide a CPU heat dissipating apparatus which eliminates the aforesaid drawbacks.

According to one aspect of the present invention, the CPU heat dissipating apparatus comprises a radiating panel attached to the top side of a CPU to hold a fan between two opposite upright side walls on the radiating panel, and a mounting frame fastened to the CPU to hold down the heat sink, wherein the radiating panel has two fan bearing portions on two opposite upright side walls thereof for holding firmly the fan within the radiating panel; the mounting frame has two short downward hooks respectively extended from a first two opposite sides thereof and respectively hooked on two opposite mounting grooves on the two opposite upright side walls of the radiating panel, and two long downward hooks respectively extended from a second two opposite sides thereof and respectively hooked on the border of the CPU to tightly secure the radiating panel to the CPU.

According to another aspect of the present invention, the mounting frame further comprises two oblique finger plates for moving by fingers to deform the second two opposite sides of the mounting frame for permitting the long downward hooks to be conveniently hooked on or released from the CPU.

According to still another aspect of the present invention, the radiating panel comprises a plurality of radiating fins disposed at an elevation below the fan bearing portions for quick dissipation of heat and for permitting the second two opposite sides of the mounting frame and the long downward hooks to be deformed by squeezing the oblique finger plates, so that the long downward hooks can be fastened to the CPU.

According to still another aspect of the present invention, when the oblique finger plates are released from the fingers after the long downward hooks are respectively fastened to the CPU, the second two opposite sides of the mounting frame immediately return to their former shapes to move back the long downward hooks, causing the radiating panel to be forced downwards against the CPU, and therefore the radiating panel and the CPU are tightly connected together and heat can be quickly carried away from the CPU through the radiating panel.

DESCRIPTION OF THE DRAWINGS

The present invention will now be described by way of example with reference to the annexed drawings, in which.

DETAILED DESCRIPTION OF THE PREFERRED EMBODIMENT

Figure 1:
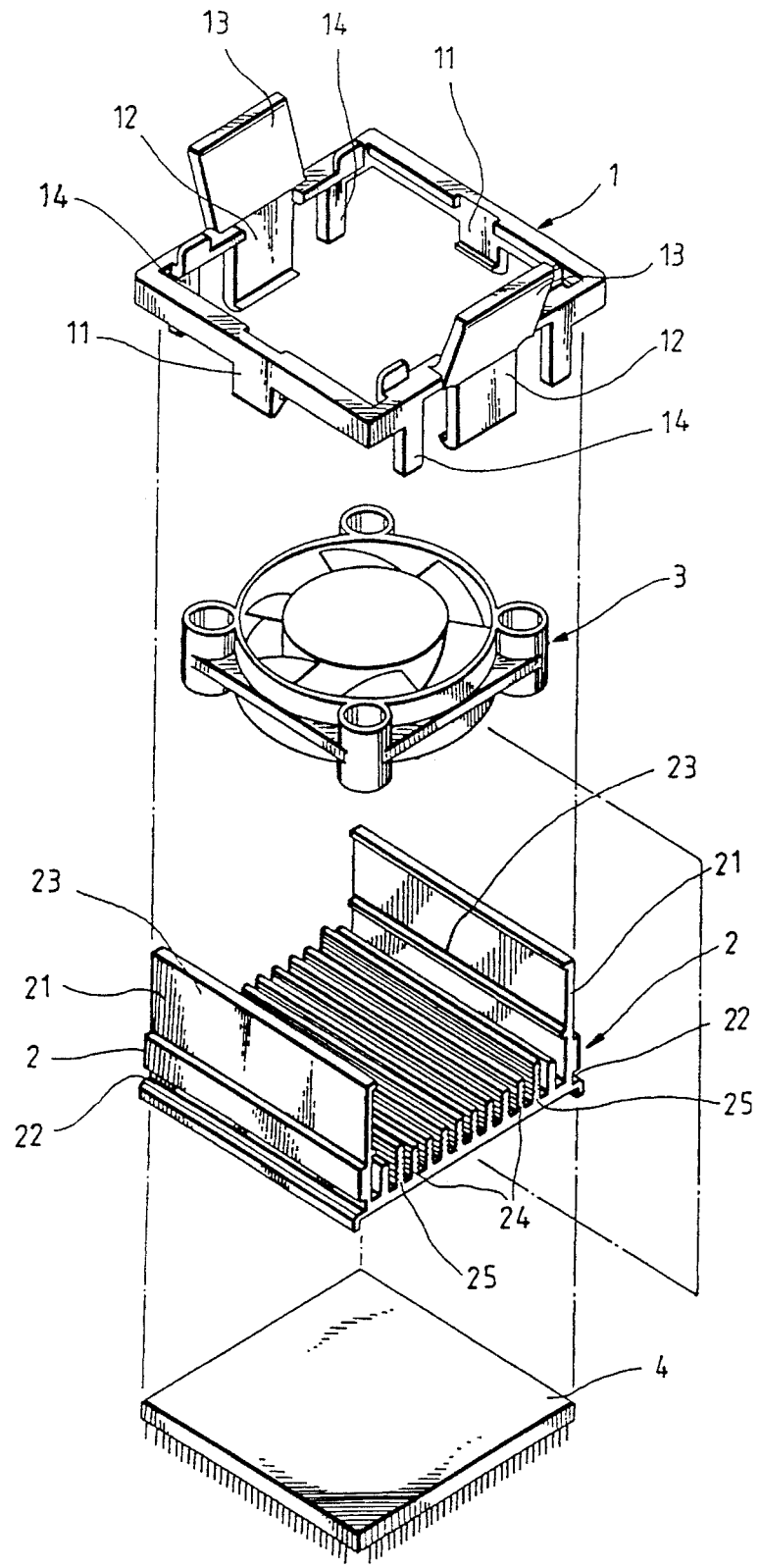
FIG. 1 is an exploded view of a CPU heat dissipating apparatus according to the preferred embodiment of the present invention.

Referring to FIG. 1, a CPU heat dissipating apparatus in accordance with the present invention is generally comprised of a mounting frame 1, a radiating panel 2, a fan 3, and a CPU (central processing unit) 4. The mounting frame 1 is a substantially rectangular open frame having two short downward hooks 11 at a first two opposite sides, two long downward hooks 12 at a second two opposite sides, two outwardly extended oblique finger plates 13 respectively disposed above the long downward hooks 12, and at least one stop plate 14 respectively disposed by each long downward hook 12o In this preferred embodiment, there are two opposite pairs of stop plates 14 disposed at two opposite sides by each long downward hook 12. The radiating panel 2 is made substantially in the shape of a U-channel, comprising two upright side walls 21 at two opposite sides corresponding to the short downward hooks 11 of the mounting frame 1, two mounting grooves 22 respectively made along the bottoms of the outer sides of the upright side walls 21 accomodating the hooks 11 of the mounting frame 1, two fan bearing portions 23 respectively made on the inner sides of the upright side walls 21 for holding the fan 3, parallel radiating fins 24 disposed between and in parallel with the upright side walls 21 at an elevation below the fan bearing portions 23, a plurality of guide ribs 25 disposed between the radiating fins 24 and the upright side walls 21 and raised over the topmost edges of the parallel radiating fins 24. The guide ribs 25 designed to engage against the stop plates 14 of the mounting frame 1 for permitting the oblique finger plates 13 to be squeezed inwards toward each other to deform the mounting frame 1 for quick installation. The fan 3 is mounted between the fan bearing portions 23 of the heat sink 2 and operated to expel heat from the radiating panel 2. The CPU 4 has a top side (opposite to the contact pins) that fits the against bottom side of the radiating panel 2.

Figure 2:
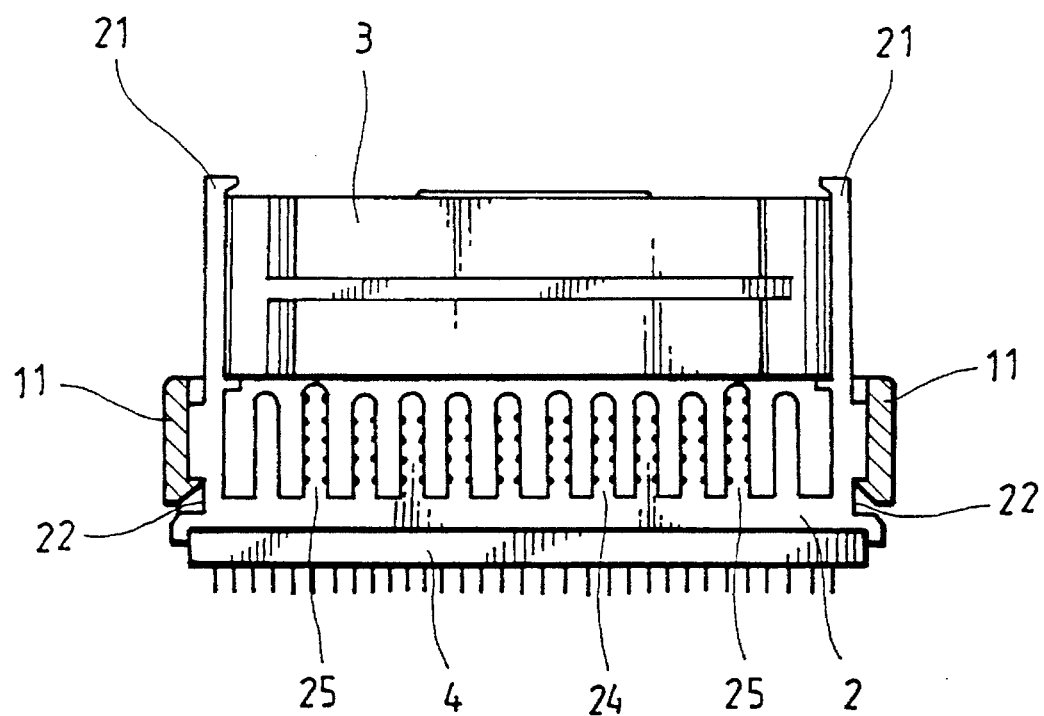
FIG. 2 is an assembly view in section of the CPU heat dissipating apparatus shown in FIG. 1.
Figure 3:
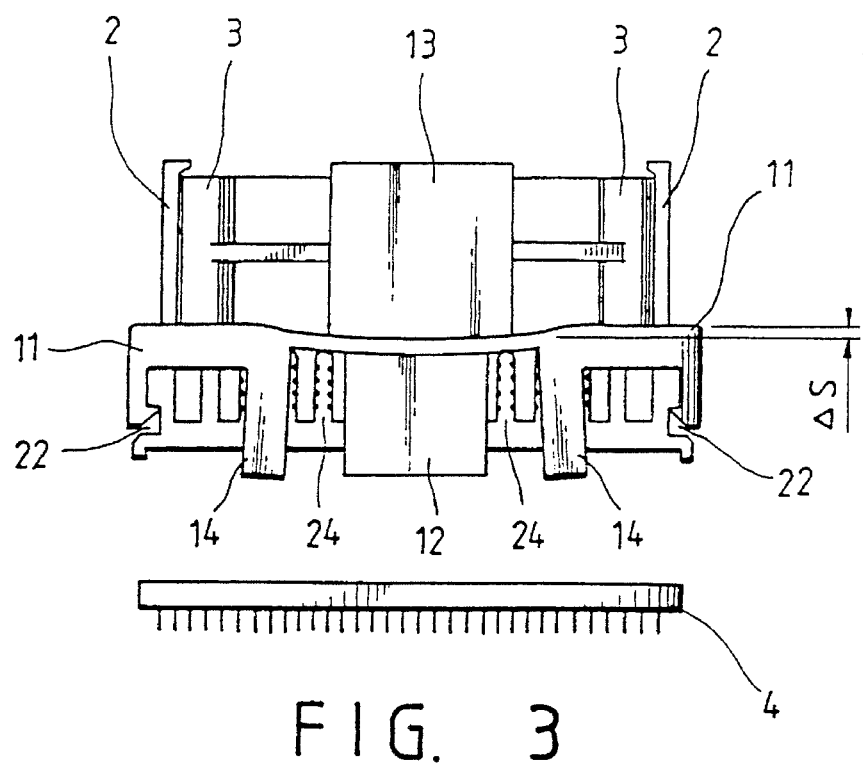
FIG. 3 shows the assembly procedure of the present invention (STEP I)
Figure 4:
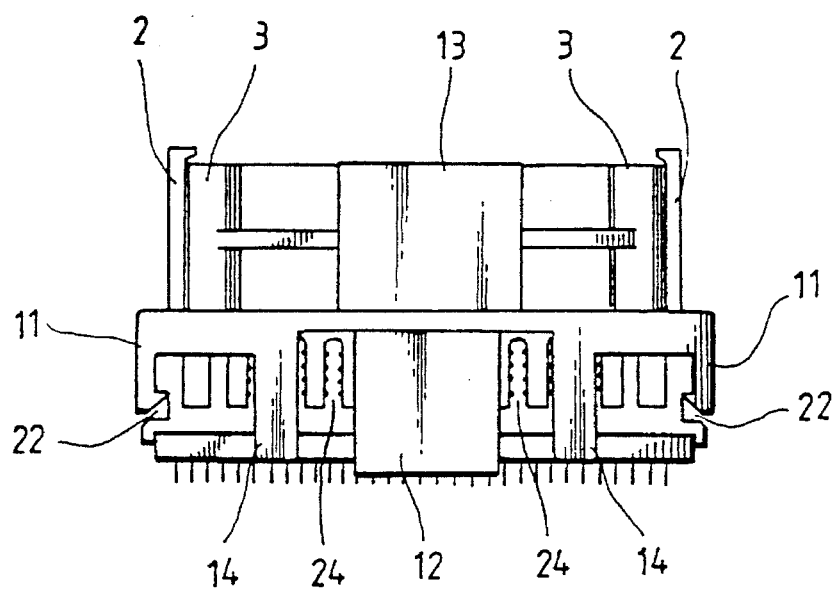
FIG. 4 shows the assembly procedure of the present invention (STEP II).

The assembly process of the present invention is easy and outlined hereinafter with reference to FIGS. 2, 3 and 4. The short downward hooks 11 of the mounting frame 1 are respectively hooked on the mounting grooves 22 on the upright side walls 21 of the radiating panel 2, permitting the stop plates 14 to be respectively engaged against the guide ribs 25, then the fan 3 is mounted on the radiating panel 2 and retained between the fan bearing portions 23 of the upright side walls 21 of the radiating panel 2, then the CPU 4 is attached to the bottom side of the radiating panel 2, and then the oblique finger plates 13 are squeezed inwards toward each other by fingers to curve the two corresponding sides of the mounting frame 1 downwards, causing the two corresponding sides of the mounting frame 1 to produce a downward amount of deformation S, and therefore the long downward hooks 12 can be hooked on the peripheral edges of the CPU 4. This arrangement enables the CPU heat dissipating apparatus to be conveniently fastened to a CPU of different thickness. Referring to FIG. 4 again, when the oblique finger plates 13 are released from the fingers after the long downward hooks 12 are respectively fastened to the CPU 4 the two deformed sides of the mounting frame 1 immediately return to their former shapes to move back the long downward hooks 12, causing the radiating panel 2 to be forced downwards against the CPU 4, and therefore the radiating panel 2 and the CPU 4 are tightly connected together and heat can be quickly carried away from the CPU 4 through the radiating panel 2.

It is to be understood that the drawings are designed for purposes of illustration only, and are not intended as a definition of the limits and scope of the invention disclosed.

What is claimed is:

1. A CPU heat dissipating apparatus comprising:

a) a mounting frame including a pair of first opposite sides and a pair of second opposite sides, the first and second opposite sides being connected together around a border of the frame, two short hooks, each short hook extending downwardly from a first opposite side, two long hooks, each long hook extending downwardly from a second opposite side, and two finger plates, each finger plate extending outwardly from a second opposite side and disposed above the long hook;

b) a radiating panel including upright sidewalls at a pair of opposite sides corresponding in position to the short hooks of the mounting frame, a mounting groove formed on an outer side of each upright sidewall, a fan bearing portion formed on an innerside of each upright sidewall, and a plurality of parallel radiating fins disposed between and in parallel with the upright sidewalls at an elevation below the fan bearing portions;

c) a fan for mounting between the fan bearing portions of the radiating panel; and d) wherein during assembly of the apparatus, the short hooks are hooked on the mounting grooves on the upright sidewalls for holding the radiating panel in the mounting frame and permitting the radiating panel to be tightly attached to a CPU when the finger plates are urged inwardly to permit the long hooks to engage opposite sides of the CPU and be secured thereto upon release of the finger plates.

2. The CPU heat dissipating apparatus of claim 1 wherein the mounting frame further includes at least one pair of stop plates, each stop plate extending downwardly from a second opposite side adjacent the long hook for engaging a border of the radiating panel during assembly of the radiating panel to the mounting frame.

3. The CPU heat dissipating apparatus of claim 1 wherein the radiating fins are disposed at an elevation below the second opposite sides of the mounting frame when the short hooks are hooked on the mounting grooves of the upright sidewalls for permitting the second opposite sides of the mounting frame to be deformed by urging the finger plates inwardly toward each other and engaging the long hooks on the opposite edges of the CPU.

4. The CPU heat dissipating apparatus of claim 2 wherein the radiating panel further includes a plurality of guide ribs disposed between the radiating fins and the upright side walls, the guide ribs extending over the upper most edges of the radiating fins for engaging against the stop plates of the mounting frame during assembly of the mounting frame to the radiating panel. this case.

* * * * *